United States Patent
Querbach et al.

(10) Patent No.: US 7,480,360 B2
(45) Date of Patent: Jan. 20, 2009

(54) REGULATING A TIMING BETWEEN A STROBE SIGNAL AND A DATA SIGNAL

(75) Inventors: Bruce Querbach, Orangevale, CA (US); Mohammad A. Abdallah, Folsom, CA (US); Amjad M. A. Khan, Folsom, CA (US); Mir M. Hossain, Rancho Cordova, CA (US); Sanjib M. Sarkar, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 562 days.

(21) Appl. No.: 11/124,553

(22) Filed: May 6, 2005

(65) Prior Publication Data

US 2006/0265161 A1 Nov. 23, 2006

(51) Int. Cl.
*H04L 7/00* (2006.01)

(52) U.S. Cl. .................. 375/356; 375/355; 375/372; 375/373; 375/371; 713/401; 713/400; 713/500

(58) Field of Classification Search ............ 375/371, 375/355, 224, 356, 372, 373; 713/500, 401, 713/400; 710/118
See application file for complete search history.

(56) References Cited

U.S. PATENT DOCUMENTS 6,401,213 B1 * 6/2002 Jeddeloh ................. 713/401
6,889,334 B1 * 5/2005 Magro et al. ............ 713/500

* cited by examiner

*Primary Examiner*—Phuong Phu
(74) *Attorney, Agent, or Firm*—Trop, Pruner & Hu, P.C.

(57) ABSTRACT

A technique includes in response to a training mode, communicating between a device and a processor of a computer system over a data bit line of a bus. The technique includes based on the communication, regulating a timing between a strobe signal and a signal that propagates over the data bit line.

19 Claims, 10 Drawing Sheets

| INPUT VECTOR | RESULT | |
|---|---|---|
| 1000111111111111 | LEFT BOUNDARY: POS ONE<br>RIGHT BOUNDARY: POS. FOUR | PASS |
| 0000000000000000 | LEFT BOUNDARY: POS. ZERO<br>RIGHT BOUNDARY: FAILED TO DETECT | PASS |
| 0111111111111111 | LEFT BOUNDARY: POS. ZERO<br>RIGHT BOUNDARY POS. ONE | PASS |
| 1111111111111110 | LEFT BOUNDARY: POS. FIFTEEN<br>RIGHT BOUNDARY: FAILED TO DETECT | PASS |
| 1110010111111111 | LEFT BOUNDARY: POS. THREE<br>AND POS. SIX | FAIL |
| 1111111111111111 | LEFT BOUNDARY: FAILED TO DETECT<br>RIGHT BOUNDARY: FAILED TO DETECT | FAIL |

Rows 1–4 are grouped as 202; rows 5–6 are grouped as 204. Table labeled 200.

FIG. 6

REGULATING A TIMING BETWEEN A STROBE SIGNAL AND A DATA SIGNAL

BACKGROUND

The invention generally relates to regulating a timing between a strobe signal and a data signal.

For purposes of communicating data across a bus between a source (providing the data) and a receiver (receiving the data) in a bus operation, the source typically furnishes both data bit signals that indicate the bits of the data and a strobe signal to the bus. The strobe signal has distinct timing edges (rising edges, for example) that are used by a receiver to synchronize the capture of data from the data bit signals; and each data bit signal has "data eyes" in which the data bit signal indicates a bit of data. Thus, during the bus operation, the receiver responds to each rising edge of the strobe signal to ideally sample the data bit signals inside the data eyes to capture a set of bits from the bus.

BRIEF DESCRIPTION OF THE DRAWING

FIG. 6 is a table depicting exemplary states of a test vector used in the link training of the strobe signal according to an embodiment of the invention.

DETAILED DESCRIPTION

Figure 1:
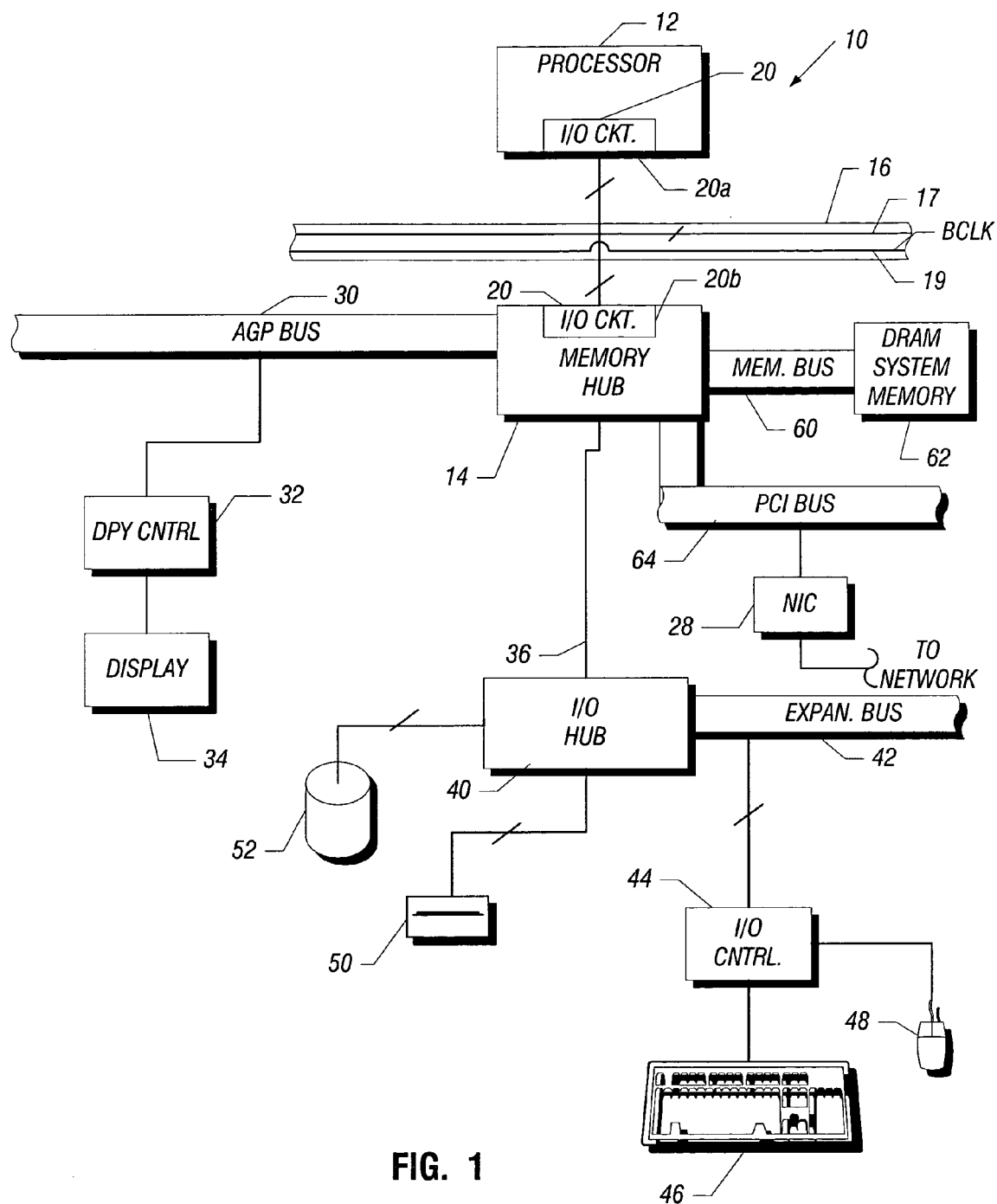
FIGS. 1 and 10 are schematic diagrams of computer systems according to different embodiments of the invention.

Referring to FIG. 1, an embodiment 10 of a computer system in accordance with the invention uses link training to determine and adjust timing relationships between a strobe signal and data bit signals that are received from a front side bus (FSB) 16. More specifically, the FSB 16 provides a communication link between a processor 12 (a central processing unit (CPU), as an example) and other bus agents that are coupled to the FSB 16, such as a north bridge, or memory hub 14, for example. The FSB 16 includes data bit lines 17 that communicate the data bit signals and as well as a strobe signal line 19 that communicates the strobe signal (called "BCLK" in FIG. 1).

In accordance with some embodiments of the invention, the agents that are coupled to the FSB 16, such as the processor 12 and the memory hub 14, each include an input/output (I/O) circuit 20. For example, the processor 12 includes an I/O circuit 20a, and the memory hub 14 includes an I/O circuit 20b, each of which have a common design denoted by the reference numeral "20."

The I/O circuit 20 adjusts timing relationships between the data bit signals and the strobe signal. More specifically, in accordance with some embodiments of the invention, the I/O circuit 20 generates internal delayed strobe signals, each of which is associated with a different one of the data bit signals and is used to trigger the capture of data from the associated data bit signal. The I/O circuit 20 uses link training to for each data bit signal, determine a strobe delay to apply to the strobe signal to generate the corresponding delayed strobe signal. Thus, for example, if the FSB 16 includes sixty-four data bit lines 17, then the I/O circuit 20 independently evaluates the timing between the strobe signal and each of the sixty-four data bit signals provided by the lines 17, and in response to this evaluation, the I/O circuit 20 establishes sixty-four strobe delays.

In accordance with some embodiments of the invention, the I/O circuit 20 may be placed in one of two link training modes: an initial link training mode in which the I/O circuit 20 initially determines the strobe delays; and a second active link training mode in which the I/O circuit 20 continually evaluates and adjusts the strobe delays for purposes of accommodating changes, such as voltage and temperature changes, for example, which affect the timing relationships between the strobe signal and the data bit signals.

Among the other features of the computer system 10, in some embodiments of the invention, the computer system 10 includes such features as a memory bus 60, a Peripheral Component Interconnect (PCI) bus 64 and an Accelerated Graphics Port (AGP) bus 30, all of which are coupled to the memory hub 14. The PCI Specification is available from The PCI Special Interest Group, Portland, Oreg. 97214. The AGP is described in detail in the Accelerated Graphics Port Interface Specification, Revision 1.0, published on Jul. 31, 1996, by Intel Corporation of Santa Clara, Calif.

The memory bus 60 couples a system memory 62 (a dynamic random access memory (DRAM), for example, as depicted in FIG. 1) to the memory hub 14; and the PCI bus 64, may, for example, couple a network interface card (NIC) 28 to the PCI bus 64. Furthermore, a display 34 may be coupled to the AGP bus 30 via a display control interface 32.

In some embodiments of the invention, the computer system 10 may also include a south bridge, or I/O hub 40, that communicates with the memory hub 14 over a hub link 36. The I/O hub 40 may, for example, provide an interface for one or more hard disk drives, such as a hard disk drive 52, as well as provide an interface for a CD-ROM drive 50. Furthermore, in some embodiments of the invention, the I/O hub 40 may be coupled to an expansion bus 42. An I/O controller 44 may be coupled to the expansion bus 42 for purposes of coupling a keyboard 46 and a mouse 48 to the computer system 10.

It is noted that the computer system 10 is illustrated for purposes of an example of one out of many possible embodiments of the invention; and thus, other embodiments are possible and are within the scope of the appended claims.

Figure 2:
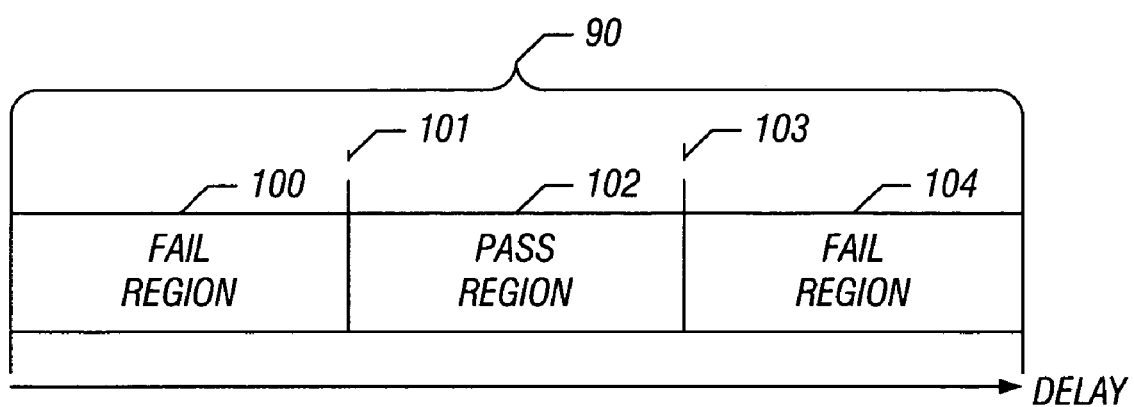
FIG. 2 is an illustration of a range of delays that the input/output circuit of FIG. 1 applies to a strobe signal during an initial link training mode according to an embodiment of the invention.

Referring to FIG. 2, in accordance with some embodiments of the invention, for each data bit line 17, the I/O circuit 20 applies a strobe delay that falls within a range 90 of possible strobe delays. Thus, in some embodiments of the invention, at the beginning of the range 90, the delay may be zero, although other beginning delays of the range 90 may be used in other embodiments of the invention. It is generally assumed in the embodiments below that the range 90 defines three distinct regions for data capture: a region 100 (called a "fail region") located in the beginning of the range 90, which is a range in which the strobe delay does not cause the delayed strobe signal to align within the eye of the associated data bit signal (and thus, causes a failed data capture); an intermediate region of the range 90 (called a "pass region 102"), which is a region in which the strobe delay causes the delayed strobe signal to align inside the data eye (and thus, causes a successful data capture); and a region (called a "fail region 104") located at the end of the range 90, which is another region in which the strobe delay does not cause the delayed strobe signal to be aligned with the data eye of the data bit signal.

The strobe delay ideally falls near (or at) the midpoint of the pass region 102, in some embodiments of the invention. For purposes of locating the midpoint of the pass region 102, in some embodiments of the invention, the techniques that are described herein find the left boundary 101, or the smallest delay of the pass region 102, and the right boundary 103, or the largest delay value, of the pass region 102. Thus, the I/O circuit 20 determines the midpoint of the pass region 102 by determining the average of the left 101 and right 103 boundaries.

In some embodiments of the invention, the range 90 that is depicted in FIG. 2 may correspond to a range of discrete delay values. As a more specific example, in the embodiments of the invention that are described below, sixteen possible values are assumed for the strobe delay and thus, for the range 90. Depending on the particular embodiment of the invention, the delays may be regularly spaced apart in time, although other relationships may exist between the delays in other embodiments of the invention. However, regardless of the relationship between the delays of the range, the delays increase from a minimum delay to a maximum delay. The goal of the link training described herein is to define the middle of the pass region 102, or the midpoint of the delays, for purposes of centering the timing edges of the data strobe signal in the data eyes of the data bit signal.

Figure 3:
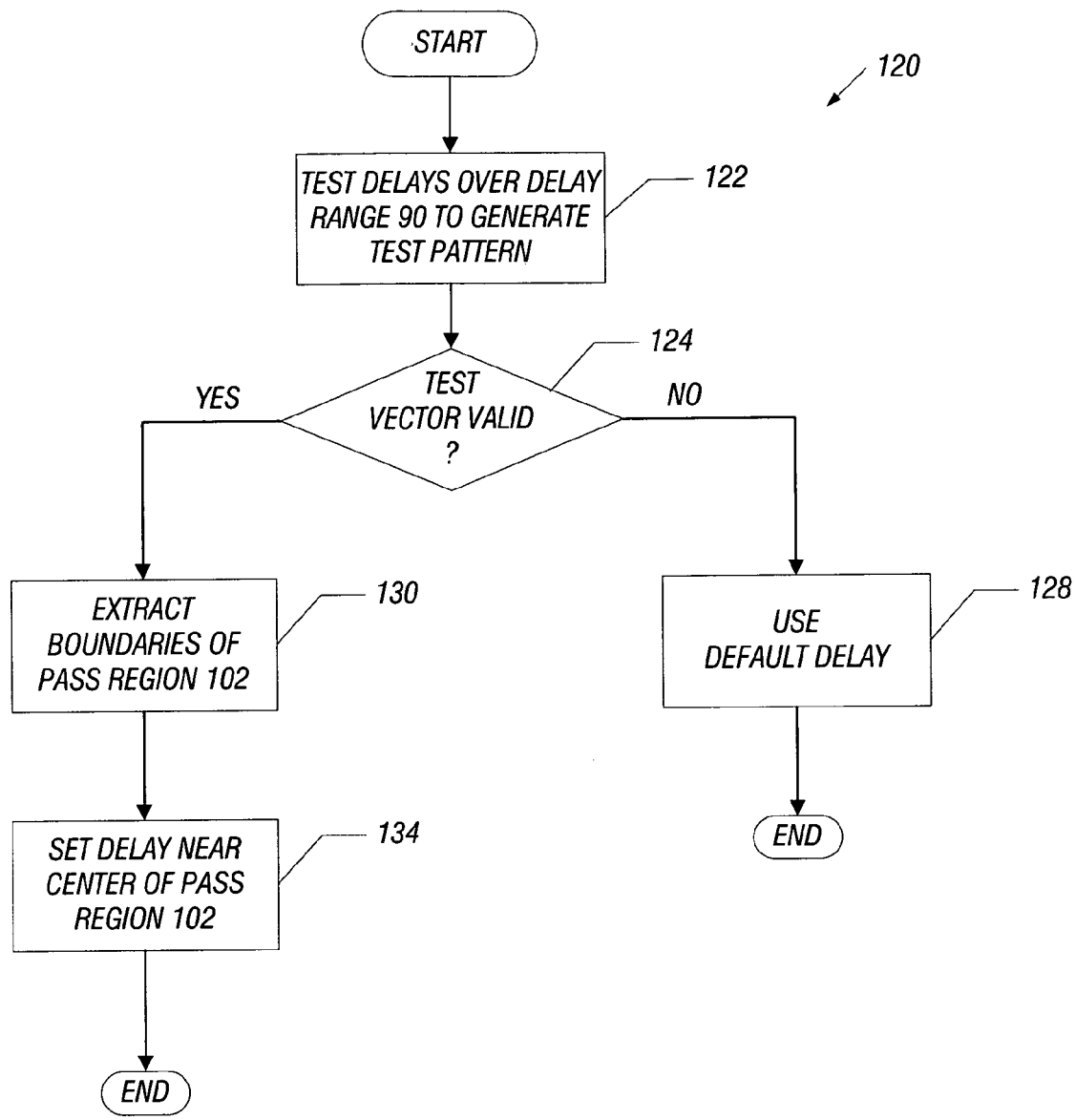
FIG. 3 is a flow diagram depicting a technique to establish a timing between a strobe signal and a data bit signal in an initial link training mode according to an embodiment of the invention.

As mentioned above, in accordance with some embodiments of the invention, the I/O circuit 20 has two link training modes of operation. The first mode of operation is the initial link training mode in which the I/O circuit 20 finds the center of the midpoint of the pass region 102 for each data bit line. Thus, referring to FIG. 3, in accordance with some embodiments of the invention, a technique 120 that is used by the I/O circuit 20 includes testing (block 122) all of the delays over the range 90 (see FIG. 2) of delays for purposes of generating a test vector. For example, as further described below, in some embodiments of the invention, the I/O circuit 20 tests each delay of the range 90; and a binary value is assigned indicating the result of the test. For example, to test a particular delay of the range, one or more predetermined data bit signals (i.e., a test pattern) are communicated over the relevant data bit line 17 of the FSB 16. If the data that is captured and read by the bit line is valid (i.e., if the captured data matches the test pattern of data), then the I/O circuit uses a flag, such as "0" to designate the tested delay as passing. Conversely, if the captured data does not match the test pattern, then the I/O circuit 20 uses another flag, such as a binary value of "1," to designate the failure. The result of this technique is the generation of test vector, a string of binary "1"s and "0"s.

For example, after testing sixteen (as an example) delay values of a particular range 90, the I/O circuit 20 may generate a test vector of sixteen bits such as the following (as an example): "1111100000111111." Thus, bit positions zero through four indicate failed delays, or the fail region 100; bit positions five through nine indicate five successful delays, or the pass region 102 (FIG. 2); and bit positions ten through fifteen indicate the fail region 104, or values for which the delays are successful.

It is noted that as further described below, a particular test vector may be invalid. For example, the test vector may not contain a pass region. If, pursuant to the technique 120, the I/O circuit 20 determines (diamond 124) that the test vector is invalid, then the I/O circuit 20 uses (block 128) a default delay for the strobe delay for the associated data bit line 17. As further described below, this fault delay may, for example, be a factory default delay. However, if the I/O circuit 20 determines (diamond 124) that the test vector is valid, then the I/O circuit 20 extracts (block 130) the boundaries of the pass region 102 and subsequently sets (block 134) the strobe delay for the associated data bit line 17 near the center of the pass region 102.

Figure 4:
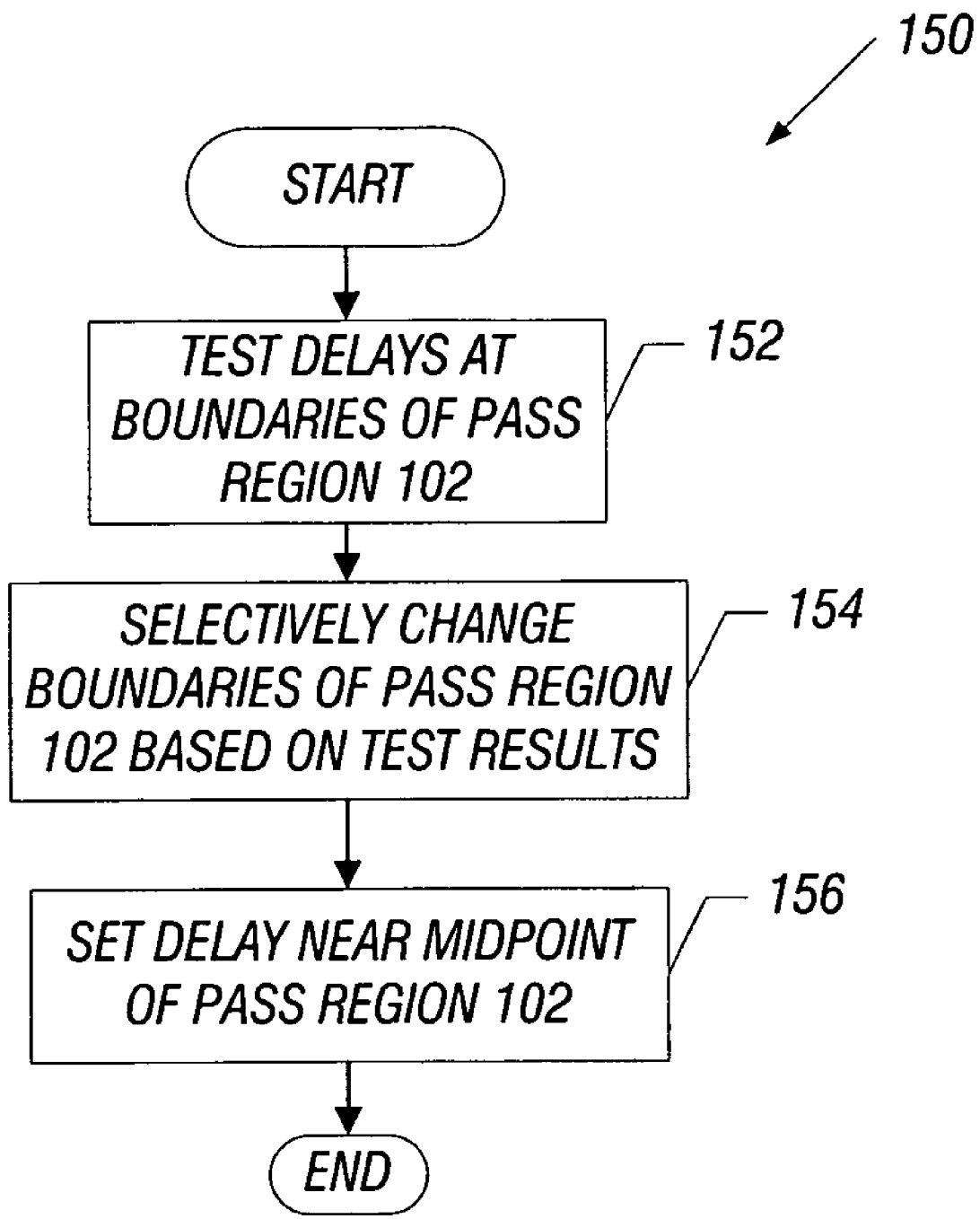
FIGS. 4 and 5 are flow diagrams depicting techniques to regulate the timing between the strobe signal and the data bit signal in an active link training mode according to embodiments of the invention.

After the initial setting of the strobe delay for each data bit line, the I/O circuit 20 enters the active link training mode in which the I/O circuit 20 checks (periodically checks, for example) the boundaries of the pass region 102. In other words, in the active link training mode, the I/O circuit 20 does not continually test all sixteen possible delays for purposes of optimizing the delay that is applied to the strobe signal. Instead, in accordance with some embodiments of the invention, the I/O circuit 20 performs a technique 150 that is depicted in FIG. 4.

Pursuant to the technique 150, the I/O circuit 20 tests (block 152) the delays at the boundaries of the pass region 102. Thus, the I/O circuit 20, using the previously-gathered link training data, tests the delays at the left 101 and right 103 boundaries. Based on these test results, the I/O circuit 20 selectively changes the boundaries of the pass region 102, as depicted in block 154. Subsequently, the I/O circuit 20 sets (block 156) the delay that is applied to the strobe signal to be near the midpoint of the pass region 102.

Figure 5:
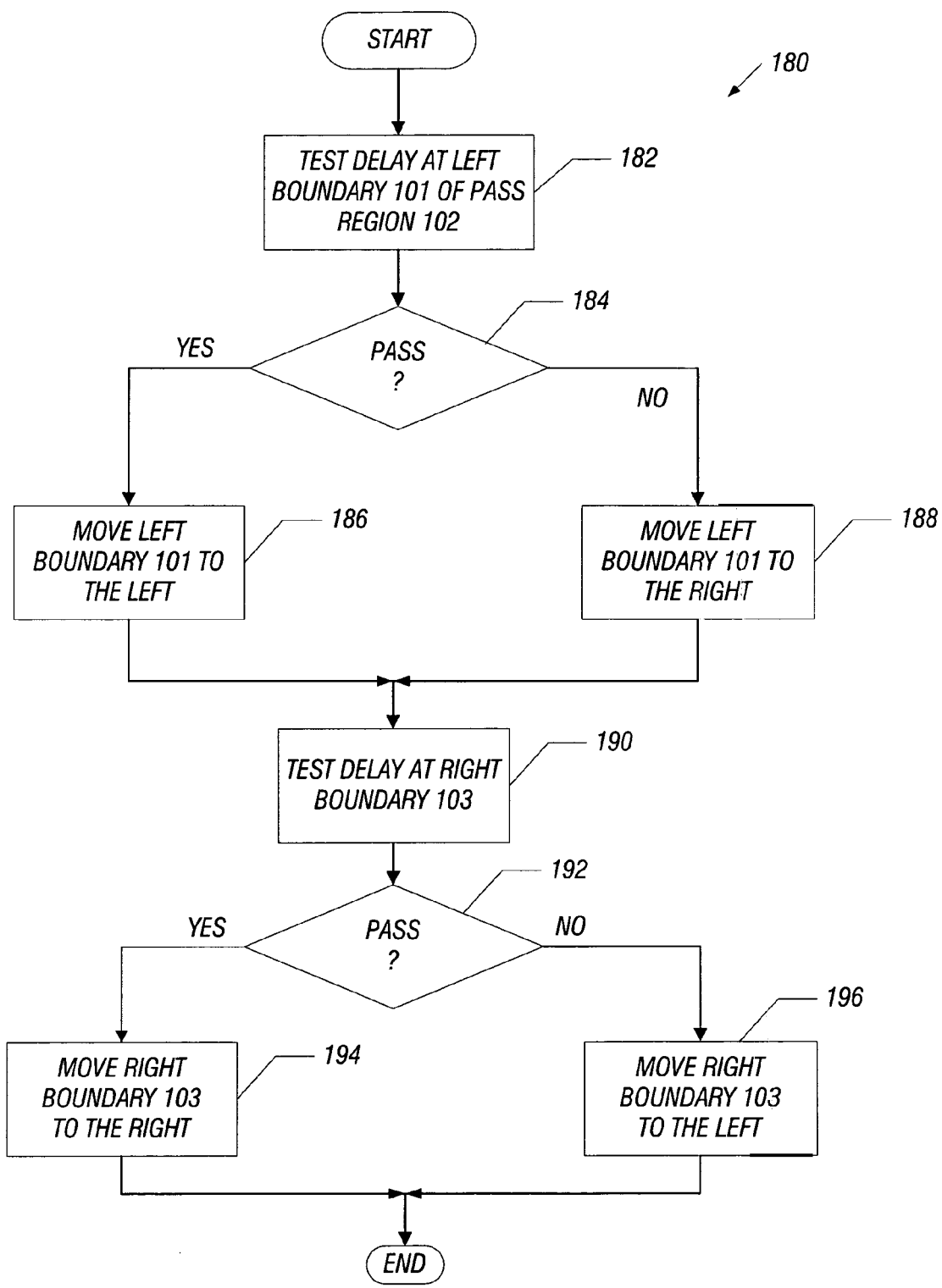

As a more specific example, referring to FIG. 5, in accordance with some embodiments of the invention, the I/O circuit 20 may use a technique 180 in the active link training mode. Pursuant to the technique 180, the I/O circuit 20 tests (block 182) the delay at the left boundary 101 of the pass region 102. If the test pattern data is successfully received and thus, the I/O circuit 20 determines (diamond 184) that the delay passed, then the I/O circuit 20 moves (block 186) the boundary 101 to the left. In other words, in accordance with some embodiments of the invention, in response to the delay passing at the left boundary 101, the I/O circuit 20 may use the next smallest delay for the left boundary 101. If, however, the delay at the left boundary 101 does not pass, then the I/O circuit 20 moves the left boundary to the right, in accordance with block 188. Thus, if the delay test fails, the I/O circuit uses the next larger delay for the left boundary 101.

Subsequently, the I/O circuit 20 tests (block 190) the delay at the right boundary 103. If the test of this delay passes (diamond 192), then the I/O circuit 20 moves (block 194) the right boundary 103 to the right. Otherwise, the I/O circuit 20 moves (block 196) the right boundary 103 to the left.

FIG. 6 depicts a table 200 illustrating exemplary potential border line cases in which the test vector does not or at least appears to not closely resemble the fail 100, pass 102 and fail 104 regions of the exemplary range 90 that is depicted in FIG. 2. Thus, the test vectors that are depicted in FIG. 6 may occur during the initial link training mode when the I/O circuit 20 generates the test vector by testing each delay of the range 100. The table 200 includes three rows 202 in which passing conditions are satisfied and two rows 204 in which failing conditions occur and cause the I/O circuit 20 to use the factory default delay.

More specifically, in the first row (referenced from the top of the table 200) of table 200, a test vector of "1000111111111111" causes the I/O circuit 20 to detect the left boundary 101 at position number one of the test vector and detect the right boundary 103 at position number four of the input vector. This test vector results in a passing condition. In other words, the left and right boundaries are used to determine the midpoint delay located between the left and right boundaries.

The second row of the table 200 includes a test vector of all zeros. For this test vector, the left boundary is detected at bit position zero. Although the I/O circuit 20 fails to detect the right boundary (i.e., no "01" exists in the test vector in row two of the table 200), the I/O circuit still designates this as a pass condition and assigns the delay at position number eight, as all delays tested passed.

Row number 3 of the table 200 depicts a test vector of "0111111111111111." For this test vector, the I/O circuit 20 detects the left boundary at bit position zero and the right boundary at bit position one. Thus, this is a passing state.

Row number 4 of the table 200 depicts a test vector of "1111111111111110." For this test vector, the I/O circuit 20 detects the left boundary at bit position fifteen and fails to detect the right boundary. However, this vector is still determined to pass, and a strobe delay that corresponds to bit position fifteen is used.

The rows 204 of the table 200 depict fail conditions in which the test vector does not produce a result that may be used to determine the strobe delay. With any of the test vectors that are depicted in the rows 204, the I/O circuit 20 assigns a factory default delay. More specifically, row 5 of the table 200 depicts a test vector of "1110010111111111." This test vector fails because two left boundaries are detected: a first left boundary at bit position three and a second left boundary at position number six. Thus, the single pass region 102, depicted in FIG. 2, is not present in this test vector.

Row 6 of table 200 depicts a test vector of "1111111111111111." For this test vector, the I/O circuit 20 (no pass boundary has been detected) can neither detect the left nor the right boundaries.

Figure 7:
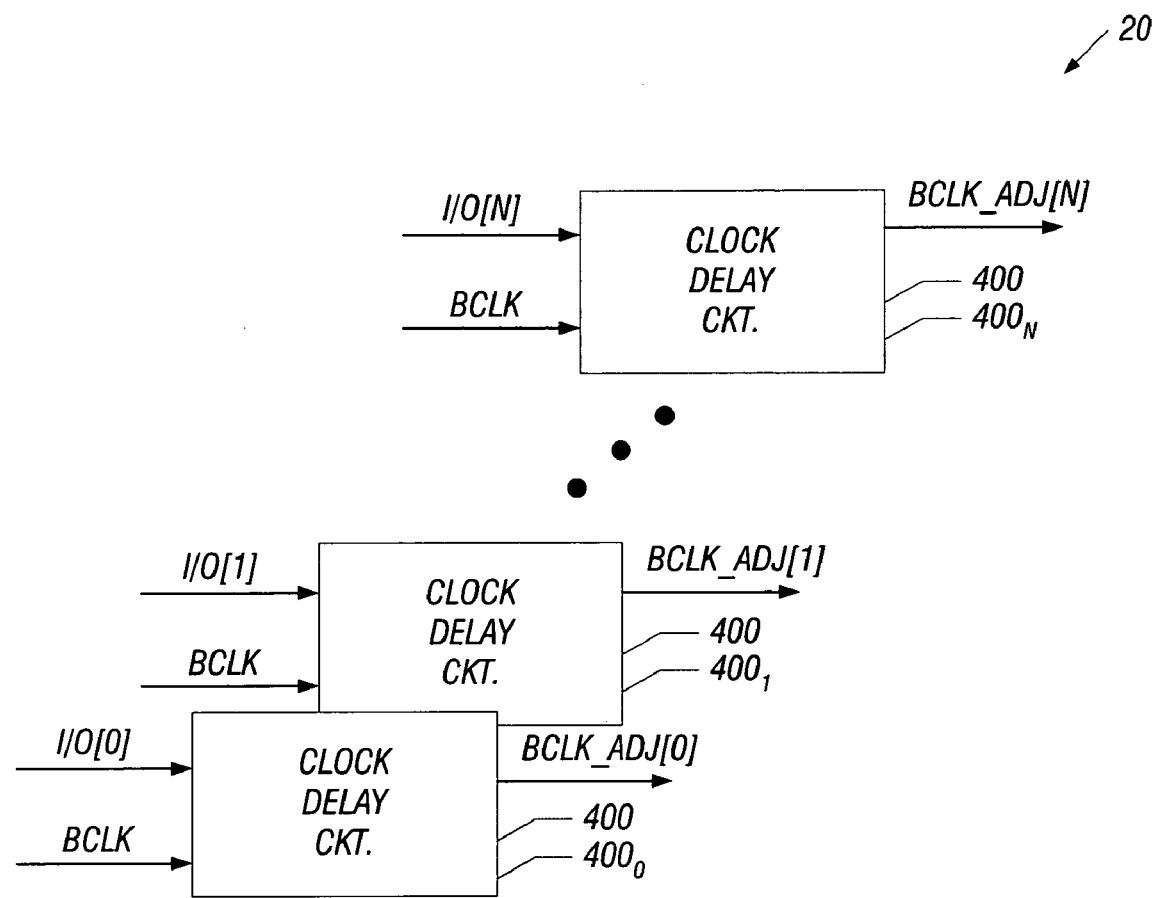
FIG. 7 is a schematic diagram illustrating the input/output circuit of the computer system of FIG. 1 according to an embodiment of the invention.

Referring to FIG. 7, in accordance with some embodiments of the invention, the I/O circuit 20 may include multiple clock delay circuits 400 (N clock delay circuits $400_0, 400_1 \ldots 400_N$, depicted as examples), each of which is associated with a particular data input line called "I/O[ ]." As a more specific example, the clock delay $400_0$ is associated with the data bit signal I/O[0]; the clock delay circuit $400_1$ is associated with the data bit signal I/O[1]; and the clock delay circuit $400_N$ is associated with the data bit signal I/O[N].

For each data bit signal I/O[ ], each clock delay circuit 400 evaluates and applies the appropriate delay to the BCLK signal (i.e., the strobe signal) from the FSB 16 (see FIG. 1) to produce a delayed BCLK signal called "BCLK_ADJ[ ]." Thus, for example, the clock delay circuit $400_1$ evaluates and determines the delay to apply to the BCLK signal to produce the BCLK_ADJ[1] signal. The BCLK_ADJ[1] signal, in turn, is used to capture data from the I/O[1] data bit signal.

Each clock delay circuit 400 operates pursuant to the initial link training mode in which the clock delay circuit 400 determines the left and right delay boundaries and establishes the initial delay to be applied to the BCLK signal accordingly. Subsequently, in an active link training mode, the clock delay circuit 400 tests the pass region boundaries for purposes of optimizing the delay that is applied to the BCLK signal.

Figure 8:
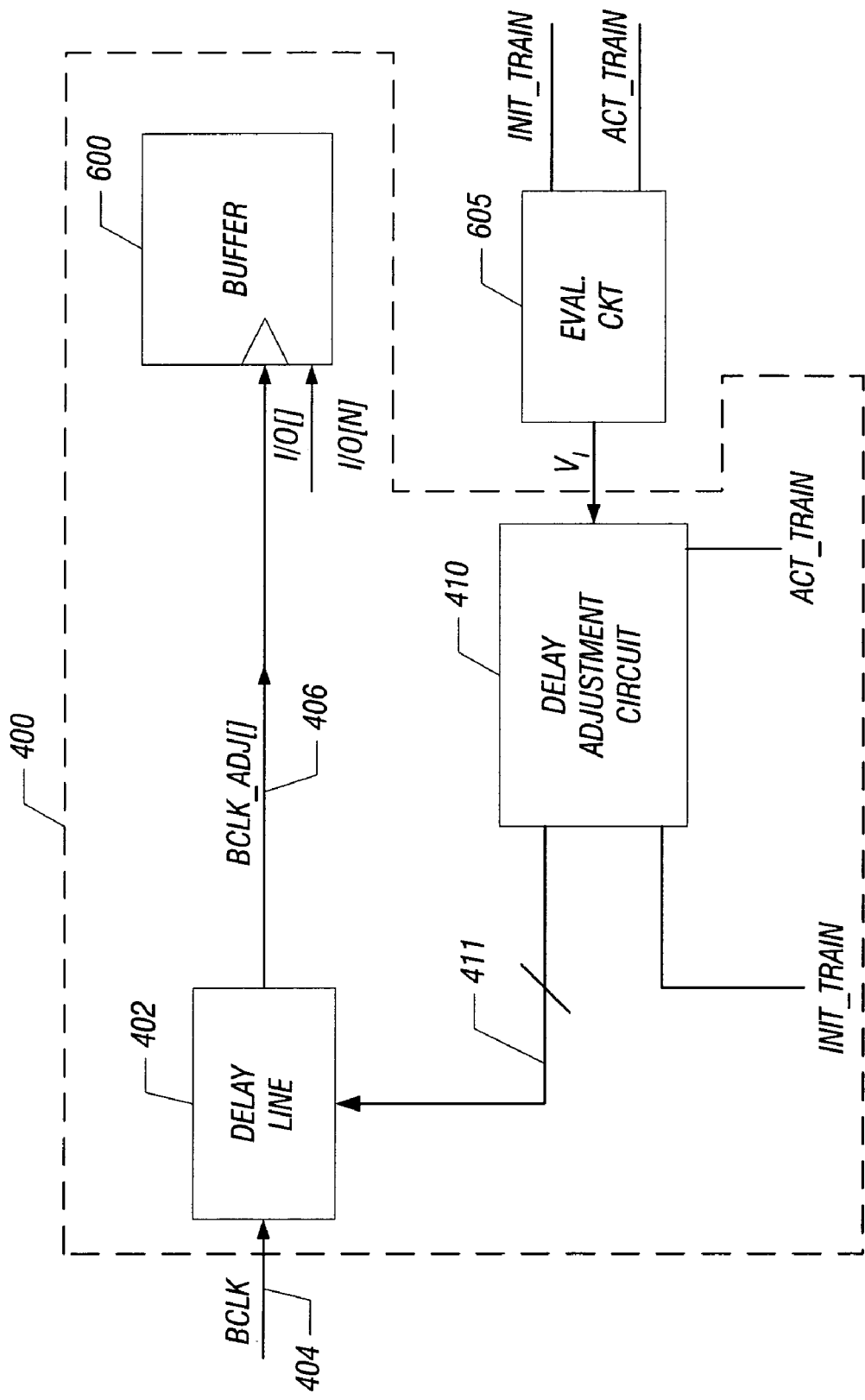
FIG. 8 is a schematic diagram depicting the clock delay circuit of FIG. 7 according to an embodiment of the invention.

Referring to FIG. 8, in some embodiments of the invention, the clock delay circuit 400 includes a delay line 402 that has an input terminal 404 that receives the BCLK signal. The delay line 402 applies a strobe delay in accordance with a digital signal that is received on input lines 411 of the delay line 402. This digital signal, in turn, is provided by a delay adjustment circuit 410. The delay adjustment circuit 410 receives a signal called "$V_I$," a signal that indicates whether a particular delay has passed or failed. In other words, the $V_I$ is used to form the "1"s and "0"s of the test vector, in some embodiments of the invention. As depicted in FIG. 8, in some embodiments of the invention, the delay line 402 provides the BCLK_ADJ signal to a clock input terminal of a data bit buffer 600, a buffer that also receives the associated I/O[ ] data bit signal.

If an evaluation circuit 605 (that is coupled to the data bit buffer 600) determines that the buffer did not capture the link training pattern of data, then the evaluation circuit 605 asserts (drives high, for example) the $V_I$ signal. Otherwise, if the evaluation circuit 605 determines that the buffer 600 did receive the test pattern, then the evaluation circuit 605 de-asserts the $V_I$ signal (drives the $V_I$ signal low, for example).

The delay adjustment circuit 410 uses the test vector that is provided by the $V_I$ signal for purposes of establishing the delay for the delay line 402 in the initial link training mode. The delay adjustment circuit 410 responds to the $V_I$ signal during the active training link mode for purposes of optimizing the delay. In some embodiments of the invention, the initial training mode is indicated by the assertion of a signal called "INIT_TRAIN," and the active training link mode is indicated by the assertion of a signal called "ACT_TRAIN."

Figure 9:
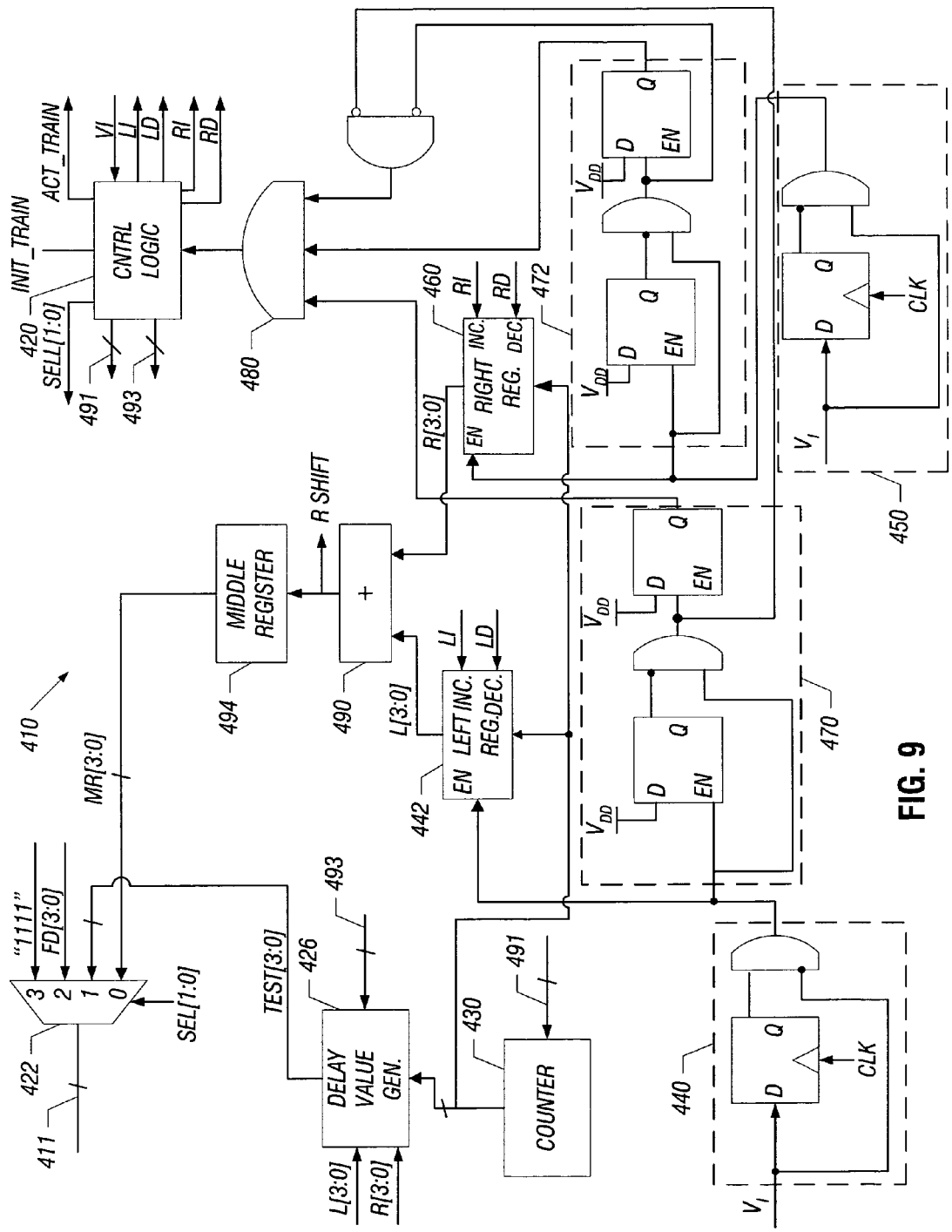
FIG. 9 is a schematic diagram of the delay adjustment circuit of FIG. 8 according to an embodiment of the invention.

As a more specific example, FIG. 9 depicts an embodiment of the delay adjustment circuit 410 in accordance with an embodiment of the invention. The delay adjustment circuit 410 includes a multibit multiplexer 422 that responds to a selection signal (called "SEL[1:0]") for purposes of selecting the digital delay value that appears on the input lines 411 of the delay line 402 (see FIG. 8). As shown in FIG. 9, depending on the value of the bits of the SEL[1:0] signal, the multiplexer 422 provides either a value of "1111" (the value used in connection with the test vector depicted in row 4 of the table 200 (FIG. 6), for example), a signal called "FD[3:0]" (a value indicative of a factory default), a signal called "TEST[3:0]" (the current delay that is used during the initial or active training link modes) or a digital signal called "MR[3:0]" (a signal indicative of the midpoint of the pass region 102 (FIG. 2)).

When placed in the active link training mode, the delay adjustment circuit 410 causes the multiplexer 422 to select the TEST[3:0] signal, a signal that is provided by a delay value generator 426. The delay value generator 426 is coupled to a counter 430 that counts sixteen training cycles over the FSB 16. Thus, for example, the counter 430 indicates a value of "0000" during the first training cycle indicates the value "0001" during the second training cycle, etc. The delay value generator 426 responds to each value generated by the counter 430 to produce a digital indication (via the TEST[3:0]) of the strobe delay to be applied by the delay line 402 (FIG. 8). Thus, via the counter 430, delay value generator 426 and delay line 402 (see FIG. 8), a different delay is applied by the delay line 402 for each training cycle during the initial link training mode.

For each training cycle, the evaluation circuit 605 (see FIG. 8) sets the state of the $V_I$ accordingly to indicate whether the delay passed or failed. A left boundary detection circuit 440 of the delay adjustment circuit 410 receives the $V_I$ signal for purposes of detecting a left boundary in the test vector. In other words, the left boundary detection circuit 440 detects when the $V_I$ signal transitions from a logic one state to a logic zero state, in some embodiments of the invention. The output terminal of the left boundary detection circuit 440, in turn, is coupled to an enable input of a left register 442. The data input terminals of the left register 442, in turn, are coupled to the output terminals of the counter 430. Therefore, when the left boundary detection circuit 440 detects the left boundary of the test vector, the left register 442 stores the output value from the counter 430 indicative of the position at which the left boundary occurs.

Similarly, the delay adjustment circuit 410 includes a right boundary detection circuit 450, a circuit that detects a logic zero to logic one transition in the test vector. Upon detection of the right boundary, the right boundary detection circuit 450 asserts a signal that is provided to a right register 460. Similar to the left register 442, the right register 460 has its data input terminals coupled to the output terminals of the counter 430. Therefore, upon detection of the right boundary, the right register 460 stores a value that is indicative of the bit position of the right boundary in the test vector.

Thus, at the conclusion of the sixteen testing cycles in the initial link training mode, the left register 442 contains data that is indicative of the left boundary 101 (see FIG. 2), and the right register 460 contains data that is indicative of the right boundary 103 (see FIG. 2). The output terminals of the left register 442 provide a digital signal (called "L[3:0]") that indicates the left boundary, and the output terminals of the right register 460 provide a digital signal (called "R[3:0]") that indicate the position of the right boundary 103.

A multibit adder 490 of the delay adjustment circuit 410 receives the L[3:0] and R[3:0] signals and adds the left and right boundaries to produce an output signal that is indicative of the summation of the right and left boundaries. This output signal is right-shifted by one bit position for purposes of dividing the summation by two. The result is stored in a middle register 494. Thus, the middle register 494 stores the approximate average of the left and right boundaries, i.e., the approximate midpoint of the pass region. This value is indicated by the MR[3:0] signal. Thus, at the conclusion of the initial link training mode, the input terminals 411 of the delay line 402 indicate the middle of the pass region.

The delay adjustment circuit 410 also includes circuitry for purposes of detecting multiple right or left boundaries in the test vector. More specifically, in some embodiments of the invention, the delay adjustment circuit 410 includes a left boundary error detection circuit 470 that, as it name implies, asserts its output signal upon detection of two left boundaries in the test vector. Similarly, the delay adjustment circuit 410 includes a right boundary error detection circuit 472 that asserts its output signal in response to the detection of more than one right boundary. An OR gate 480 receives the output signals from the error detection circuits 470 and 472 and alerts control logic 420 when more than one left boundary or more than one boundary is detected. The OR gate 480 also alerts the control logic 420 when none of the delays of the test vector passed (i.e., when the test vector is equal to "1111111111111111").

The control logic 420 controls the modes of the delay adjustment circuit 410 as well as controls the adjustment of the delay during the active link training mode. More specifically, in some embodiments of the invention, the control logic 420 controls (via the control lines 491) the counter 430 and controls the delay value generator 426 (via the control lines 493) in the following manner in the active link training mode. The control logic 420 first causes the delay value generator 426 to produce the delay pointed to by the L[3:0] signal, i.e., the contents of the left register 442. Thus, in response to the training cycle, the VI signal indicates the result as to whether the delay at the left boundary passed. If the delay did not pass, the control logic 420 asserts a signal (called "LI") to cause the left register 442 to increment its stored value by one to shift the left boundary to the right. If, however, the test succeeded, then the control logic 420 asserts a signal (called "LD") to cause the left register 442 to decrement its stored value by one to effectively shift the left boundary to the left.

Subsequently, the control logic 420 causes the delay value generator 426 to load the signal R[3:0], i.e., the contents of the right register 460, so that another test cycle may begin to test the delay that corresponds to the right boundary. If, as indicated by the VI signal, the delay at the right boundary passes, then the control logic 420 increments, via the assertion of a signal (called "RI") the contents of the right register 460 to shift the right boundary to the right by one. If, however, the test fails, then the control logic 420 asserts a signal (called "RD") to cause the right register 460 to decrement its stored value to shift the right boundary to the left by one.

Figure 10:
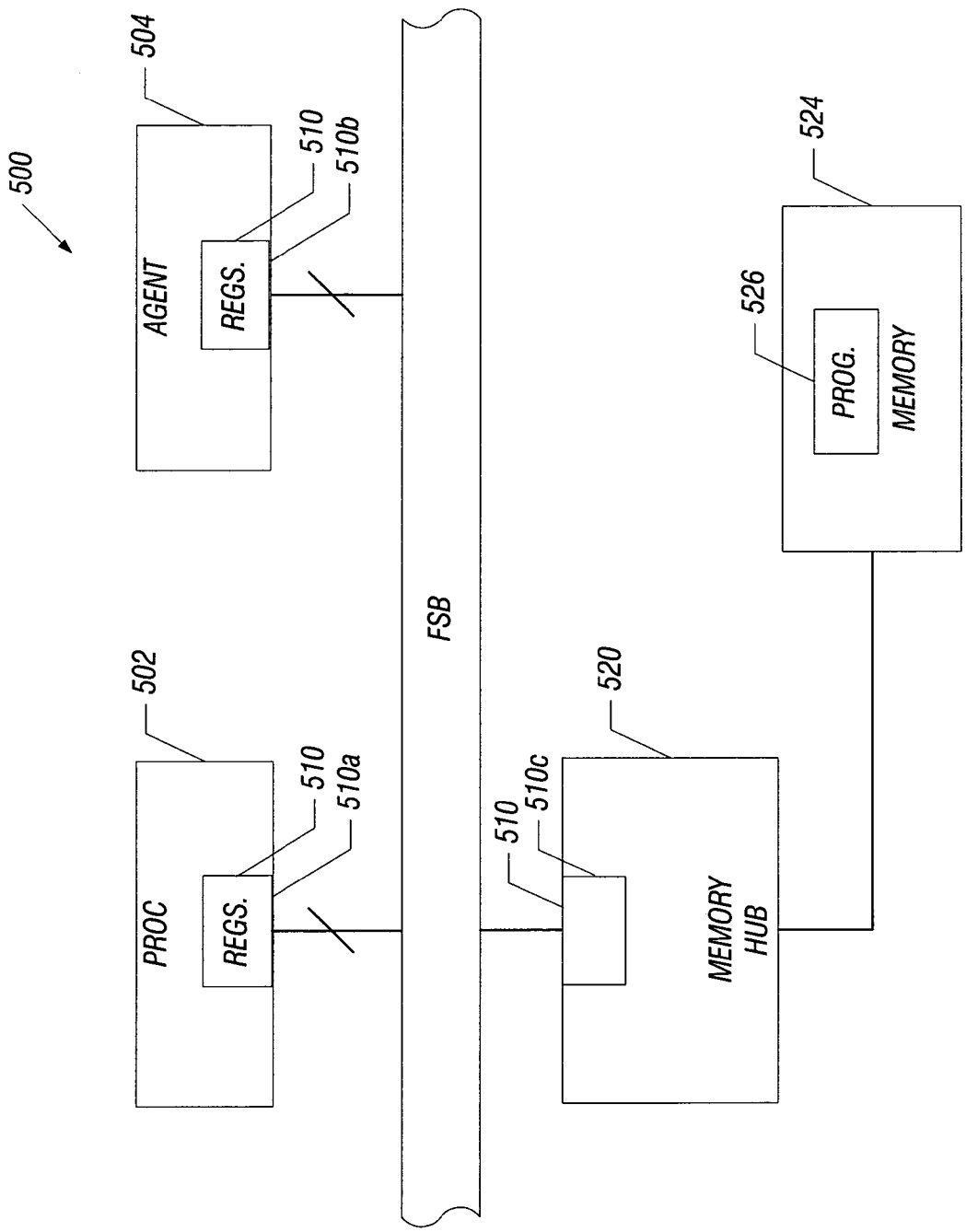

It is noted that the delay adjustment circuit 410 is one out of many possible embodiments of the invention. Thus, variations may be made that fall within the scope of the appended claims. For example, in other embodiments of the invention, the techniques that are described herein may be applied using software, in lieu of hardware. As a more specific example, FIG. 10 depicts a computer system 500 in accordance with another embodiment of the invention.

The computer system 500 includes a processor 502, a bus agent 504 and a north bridge, or memory hub 520, all of which are coupled to a front side bus (FSB) 506. Instead of containing the I/O circuitry described above, each agent that is coupled to the FSB 506 includes a set of registers 510b and the memory hub 520 includes the registers 510c. Each set of registers 510 stores data indicative of delays to be applied to the data bit signals that are received by the corresponding bus agent. In order to establish the delays for these registers 510, in accordance with some embodiments of the invention, the processor 502 executes a program 526 that is stored in a system memory 524 for purposes of implementing one or more of the techniques 120 (FIG. 3), 150 (FIG. 4) and 180 (FIG. 5) that are discussed above. Thus, many variations are possible and are within scope of the appended claims.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A method comprising:
   in response to a training mode, communicating between a device and a processor of a computer system over a data bit line of a bus;
   based on the communication, regulating a timing between a strobe signal and a signal that propagates over the data bit line, the regulating comprising:
      based on the communication, determining a subset of delays within a range of delays which may be applied to the strobe signal to cause the strobe signal to be synchronized to a data eye of the data bit signal and applying a delay within the range to the strobe signal to generate a delayed strobe signal;
      in response to the training mode, evaluating the boundaries of the range; and
      selectively moving the boundaries based on the evaluation.

2. The method of claim 1, further comprising:
   based on the communication, regulating the timing between the strobe signal and additional signals that propagate over other data bit lines of the bus.

3. The method of claim 1, further comprising:
synchronizing capture of data from the data bit signal in response to the delayed strobe signal.

4. The method of claim 1, further comprising:
determining boundaries of the range; and
selecting the delay within the range in response to the determination of the boundaries of the range.

5. The method of claim 1, wherein the delay within the range comprises a delay near a midpoint between the boundaries.

6. The method of claim 1, further comprising:
adjusting the delay in response to at least one of the boundaries moving.

7. The method of claim 1, wherein the evaluating comprises:
selecting a delay near one of the boundaries;
applying the delay to the clock signal to produce a delayed clock signal;
determining whether the delayed clock signal is synchronized to another data bit signal from the data bit line; and
based on whether the delayed clock signal is synchronized, moving said one of the boundaries and determining the delay based at least in part the moved said one of the boundaries.

8. The method of claim 1, wherein clock line and data bit line are part of a front side bus.

9. The method of claim 1, wherein the processor comprises a central processing unit.

10. A system comprising:
a bus comprising a data bit line and a clock line;
a dynamic random access memory coupled to the bus;
a processor coupled to the bus;
an agent coupled to the bus; and
a circuit to based on a communication between the processor and the agent in a training mode, regulate a timing between a strobe signal and a signal that propagates over the data bit line, the regulation comprising based on the communication, determining a subset of delays within a range of delays and applying a delay within the range to the strobe signal to generate a delayed strobe signal,
wherein the circuit is adapted to in response to the training mode, evaluate the boundaries of the range and selectively move the boundaries based on the evaluation.

11. The system of claim 10, wherein, based on the communication, the circuit regulates timing between the strobe signal and additional signals that propagate over other data bit lines of the bus.

12. The system of claim 10, wherein the circuit synchronizes capture of data from the data bit signal in response to the delayed strobe signal.

13. The system of claim 10, wherein the circuit determines boundaries of the range and selects the delay within the range in response to the determination of the boundaries of the range.

14. A bus interface comprising:
delay circuits, each delay circuit to delay a strobe signal to produce a delayed strobe signal associated with a different data bit line of a bus;
buffer circuits, each buffer circuit being associated with a different one of the delayed strobe signals and buffer circuit to capture data from a different one of the data bit lines in response to the associated delayed strobe signal; and
circuitry coupled to the delay circuits to, based on communication over the bus in a training mode, regulate timing of the delayed strobe signals, the regulation comprising based on the communication, determining a subset of delays within a range of delays and applying a delay within the range to the strobe signal to generate a delayed strobe signal,
wherein the circuitry in response to the training mode evaluates the boundaries of the range and selectively moves the boundaries based on the evaluation.

15. The bus interface of claim 14, for at least one of the delayed strobe signals, the circuitry, based on the communication, the determines a subset of delays within a range of delays which may be used to generate said at least one of the delayed strobe signals, and
the circuit applies a delay within the subset to generate said at least one of the strobe signals.

16. An article comprising a computer accessible storage medium storing instructions to, when executed, cause a computer to:
based on a communication between bus agents in a training mode, regulate a timing between a strobe signal and a signal that propagates over a data bit line of a bus, the regulating comprising based on the communication, determine a subset of delays within a range of delays which may be applied to strobe signal to cause the strobe signal to be synchronized to a data eye of the data bit signal and apply a delay within the range to the strobe signal to generate a delayed strobe signal;
in response to the training mode, evaluate the boundaries of the range; and
selectively move the boundaries based on the evaluation.

17. The article of claim 16, the storage medium storing instructions to, when executed, cause the computer to regulate timing between the strobe signal and additional signals that propagate over other data bit lines of the bus.

18. The article of claim 16, the storage medium storing instructions to, when executed, cause the computer to based on the communication:
determine a subset of delays within a range of delays which may be applied to strobe signal to cause the strobe signal to be synchronized to data eye of the data bit signal, and
apply a delay within the range to the strobe signal to generate a delayed strobe signal.

19. The article of claim 18, the storage medium storing instructions to, when executed, cause the computer to determine boundaries of the range and selects the delay within the range in response to the determination of the boundaries of the range.

* * * * *